US008488374B2

(12) United States Patent
Liu (10) Patent No.: US 8,488,374 B2
(45) Date of Patent: Jul. 16, 2013

(54) MEMORY ARRAYS (75) Inventor: Zengtao T. Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/607,681

(22) Filed: Sep. 8, 2012

(65) Prior Publication Data
US 2013/0003435 A1 Jan. 3, 2013

Related U.S. Application Data (62) Division of application No. 12/795,565, filed on Jun. 7, 2010, now Pat. No. 8,289,763.

(51) Int. Cl.
G11C 11/00 (2006.01)
(52) U.S. Cl.
USPC .......................................... 365/163; 365/148
(58) Field of Classification Search
USPC ............. 365/46, 94, 100, 113, 129, 148, 158, 365/163; 257/2–5, 296, E31.047, E27.006; 438/29, 95, 96, 166, 259, 365, 482, 486, 438/597; 977/754
See application file for complete search history.

(56) References Cited

U.S. PATENT DOCUMENTS

| 6,961,258 | B2 | 11/2005 | Lowrey |
| 7,009,278 | B2 | 3/2006 | Hsu |
| 7,388,775 | B2 | 6/2008 | Bedeschi et al. |
| 7,570,511 | B2 | 8/2009 | Cho et al. |
| 2002/0018355 | A1 | 2/2002 | Johnson et al. |
| 2004/0245547 | A1 | 12/2004 | Stipe |
| 2005/0001257 | A1 | 1/2005 | Schloesser et al. |
| 2007/0278578 | A1 | 12/2007 | Yoshida et al. |
| 2008/0175031 | A1 | 7/2008 | Park et al. |
| 2009/0059644 | A1 | 3/2009 | Kajigaya |
| 2011/0261606 | A1* | 10/2011 | Sandhu et al. ................ 365/148 |
| 2011/0261607 | A1* | 10/2011 | Tang et al. .................... 365/148 |

FOREIGN PATENT DOCUMENTS

WO PCT/US2011/035601 11/2011
WO PCT/US2011/035601 12/2012

OTHER PUBLICATIONS

Yoon, Hong Sik et al., "Vertical Cross-point Resistance Change Memory for Ultra-High Density Non-volatile Memory Applications" 2009 Symposium on VLSI Technology Digest of Technical Papers, pp. 26-27.

* cited by examiner

Primary Examiner — Harry W Byrne
(74) Attorney, Agent, or Firm — Wells St. John P.S.

(57) ABSTRACT

Some embodiments include memory arrays. The memory arrays can have global bitlines extending along a first horizontal direction, vertical local bitlines extending perpendicularly from the global bitlines, and wordlines extending along a second horizontal direction which is perpendicular to the first horizontal direction. The global bitlines may be subdivided into a first series at a first elevational level, and a second series at a second elevational level which is different from the first elevational level. The global bitlines of the first series can alternate with the global bitlines of the second series. There can be memory cell material directly between the wordlines and the vertical local bitlines. The memory cell material may form a plurality of memory cells uniquely addressed by wordline/global bitline combinations. Some embodiments include cross-point memory cell units that have areas of about $2F^2$.

12 Claims, 10 Drawing Sheets

MEMORY ARRAYS

RELATED PATENT DATA

This patent resulted from a divisional of U.S. patent application Ser. No. 12/795,565, which was filed Jun. 7, 2010, and which is hereby incorporated herein by reference.

TECHNICAL FIELD

Memory arrays.

BACKGROUND

Memory arrays are utilized for tightly packing memory cells within integrated circuitry. One type of memory which is particularly amenable to tight packing is cross-point memory.

A memory array may comprise a plurality of wordlines extending along a first direction, and a plurality of bitlines extending orthogonally to the wordlines. Cross-point memory may utilize memory cell material formed at the intersections of the bitlines and wordlines across the array. The memory cell material may be phase change material, such as chalcogenides. Example chalcogenides are alloys of germanium, antimony and tellurium.

In addition to the memory cell material, the individual memory cells may also comprise access devices which limit current to the memory cell material until a voltage differential across the memory cell material and the access device reaches a predetermined threshold. The access devices may be non-linear electronic devices. Specifically, the access devices may be electronic devices which are in a highly resistive state until a voltage differential reaches a predetermined value, whereupon the electronic devices transform to a conducting state. Example access devices are diodes and ovonic threshold switches.

Figure 1:
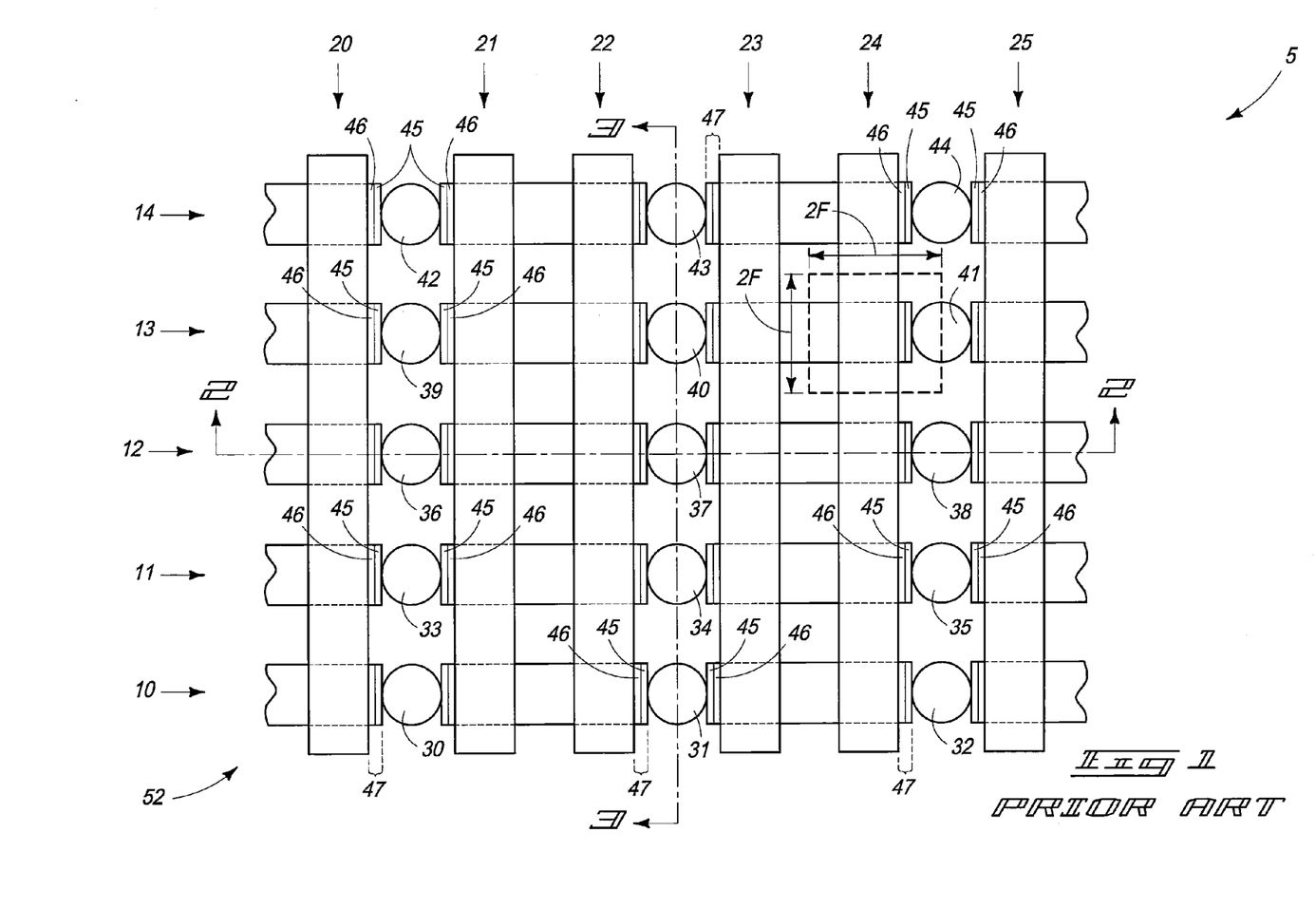
Figure 2:
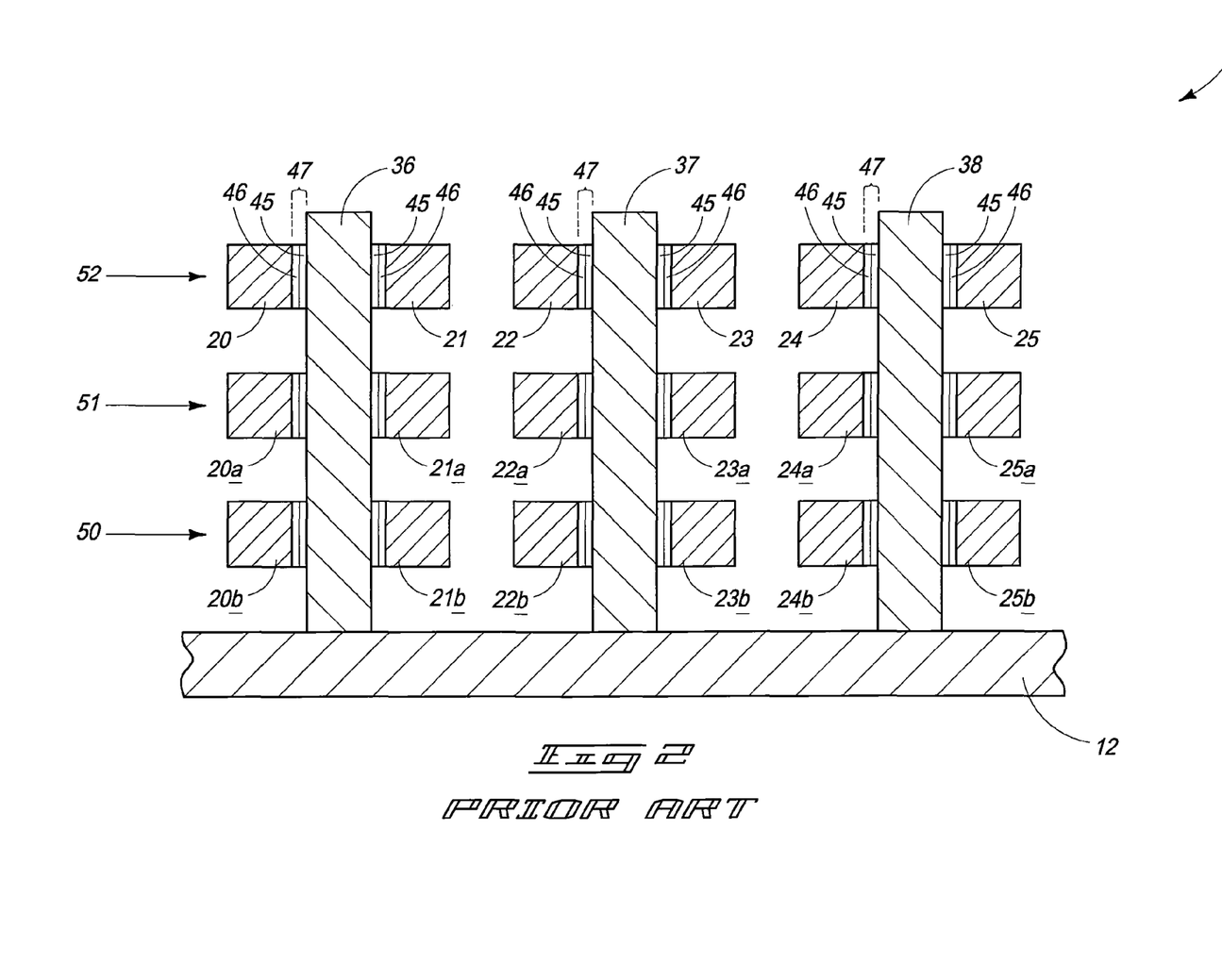
FIGS. 2 and 3 are diagrammatic cross-sectional side views along the lines 2-2 and 3-3, respectively, of FIG. 1.
Figure 3:
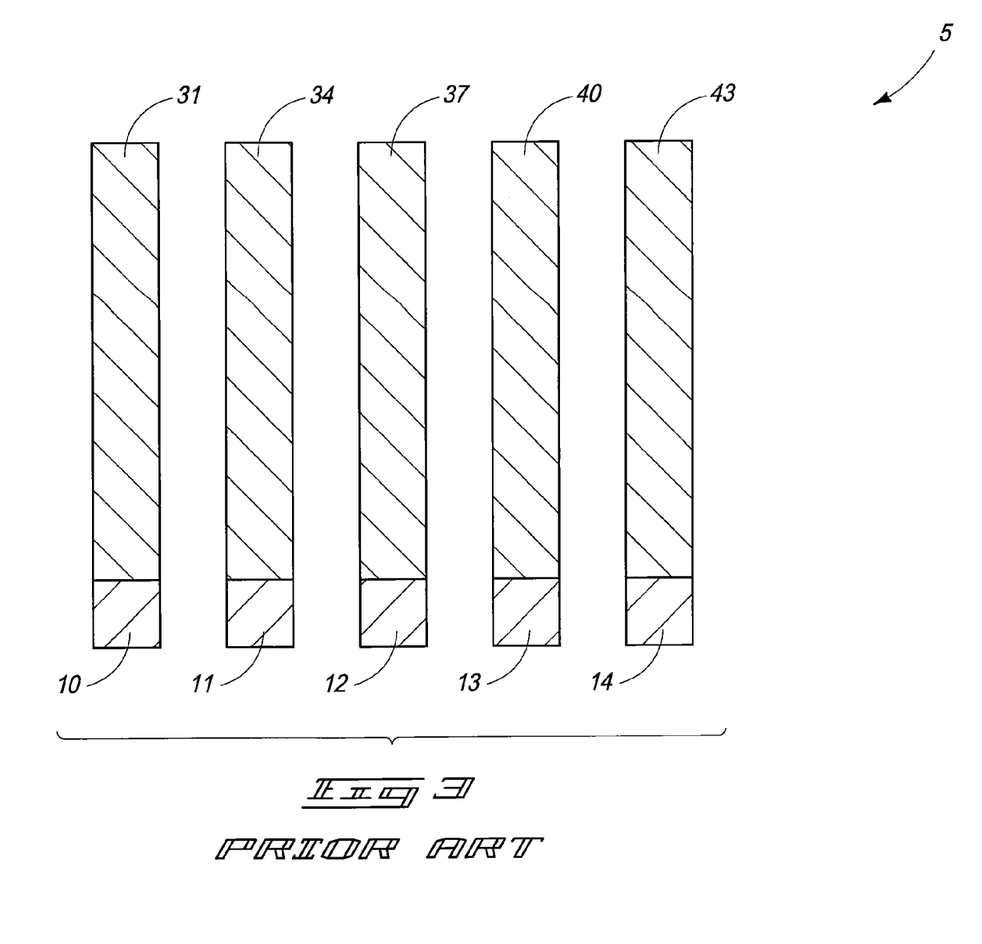

An example prior art cross-point memory array 5 is shown in FIGS. 1-3; with FIG. 1 being a top view, and with FIGS. 2 and 3 being cross-sectional side views. The cross-sectional views of FIGS. 2 and 3, like all other cross-sectional views in this disclosure, only show features within the planes of the cross-sections. The cross-sectional views do not show materials behind the planes of the cross-sections in order to simplify the drawings.

The top view of FIG. 1 shows that the memory array comprises a plurality of global bitlines 10-14 that extend along a first horizontal direction, and comprises a plurality of wordlines 20-25 that extend orthogonally to the global bitlines. The cross-sectional side view of FIG. 2 shows that the wordlines of FIG. 1 are actually the top series of a stack of wordlines, with FIG. 2 showing two underlying series of wordlines. The wordlines within one of the underlying series are labeled as wordlines 20a-25a, and the wordlines in the other of the underlying series are labeled as wordlines 20b-25b.

Eighteen wordlines (20-25, 20a-25a and 20b-25b) are shown in the cross-sectional view of FIG. 2. The eighteen wordlines form a two-dimensional wordline array having columns of three wordlines, and rows of six wordlines.

FIGS. 1-3 show that vertical bitline pillars 30-44 extend upwardly from the global bitlines. The bitline pillars extend through the wordline array, and are between some of the columns of such wordline array. The wordlines, bitlines and vertical bitline pillars comprise electrically conductive material, such as, for example, one or more of various metals, metal-containing compositions, and conductively-doped semiconductor materials.

Memory cell material 45 (only some of which is labeled) is provided between the wordlines and vertical bitline pillars; and access devices 46 (only some of which are labeled) are provided between the wordlines and the vertical bitline pillars. The memory cell material and access device provided between a wordline and a vertical bitline pillar together form a memory cell 47 (only some of which are labeled).

Although the memory cell material is shown to be a single homogeneous composition, it may comprise multiple discrete compositions in some applications. Also, although the access devices are shown to comprise single, homogeneous compositions, the access devices may comprise numerous discrete compositions; and often do comprise two or more different materials. Further, although only a single access device is shown in each memory cell, there can be multiple access devices in the individual memory cells. Also, although the memory cell material is shown directly adjacent the vertical bitline pillars, and the access devices are shown directly adjacent the wordlines, the relative orientations of the memory cell material and the access devices may be reversed.

In operation, each individual memory cell may be uniquely addressed by a combination of a global bitline and a wordline. For instance, a voltage differential between global bitline 12 and wordline 20 may be utilized to access the memory cell located at the intersection where wordline 20 crosses vertical bitline pillar 36. Such access may be utilized for writing to the memory cell by placing the memory cell in a specific data storage state, and for reading from the memory cell by ascertaining which data storage state the memory cell is in.

The wordlines within the two-dimensional wordline array of FIG. 2 may be considered to be arranged in a plurality of elevational planes 50-52, and accordingly the top view of FIG. 1 may be considered to be showing the uppermost elevational plane 52 of the wordline array. The memory array may be considered to also comprise the elevational planes 50-52, and each memory unit of the memory array may be considered to have an area along the elevational plane containing such memory unit. The area may be stated in terms of a minimum feature size, F, utilized to form the memory array. Such minimum feature size will be the widths of the bitlines, the widths of the wordlines, the widths of the vertical bitline pillars, and the widths of the spaces between the bitlines and the wordlines if the memory array is fabricated to its absolute minimum dimensions.

The top view of FIG. 1 shows a square perimeter around one of the memory units. Such perimeter has sides that are of dimension 2F, and accordingly the memory unit has an area along elevational plane 52 of about $4F^2$. The area is referred to as being "about $4F^2$," rather than as being absolutely $4F^2$ because the illustrated perimeter assumes that the memory cell material 45 and access device 46 are of negligible size. Since the memory cell material 45 and access device 46 have some physical dimension, the planar area of the memory unit cell will approach $4F^2$, but will not be $4F^2$ in an absolute mathematical sense. Alternatively, the planar area of each memory cell unit may be considered to be $4F^2$ in a context in which the memory cell material and access device are ignored; or in other words may be considered to be $4F^2$ relative to the wordlines, bitlines and spaces consumed by each memory cell unit.

BRIEF DESCRIPTION OF THE DRAWINGS

FIGS. 1-3 are diagrammatic views of a portion of a prior art memory array. FIG. 1 is a top view of the array.

FIGS. 4-6 are diagrammatic views of a portion of an example embodiment memory array. FIG. 4 is a top view of the array.

DETAILED DESCRIPTION OF THE ILLUSTRATED EMBODIMENTS

Some embodiments include new memory arrays in which cross-point memory cells may be more tightly packed than is achieved with conventional memory arrays. Example embodiments are described with reference to FIGS. 4-10.

Figure 4:
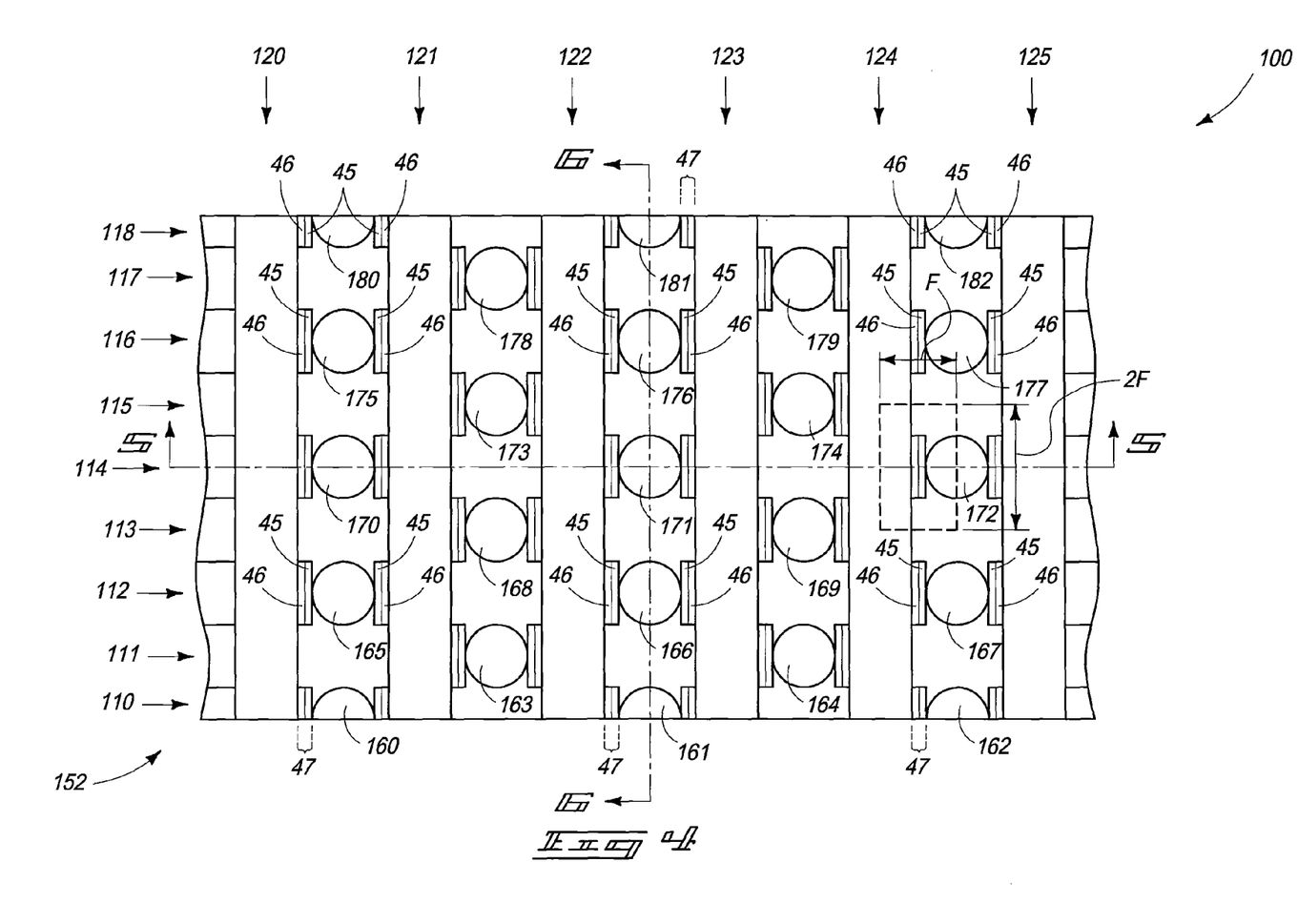
Figure 5:
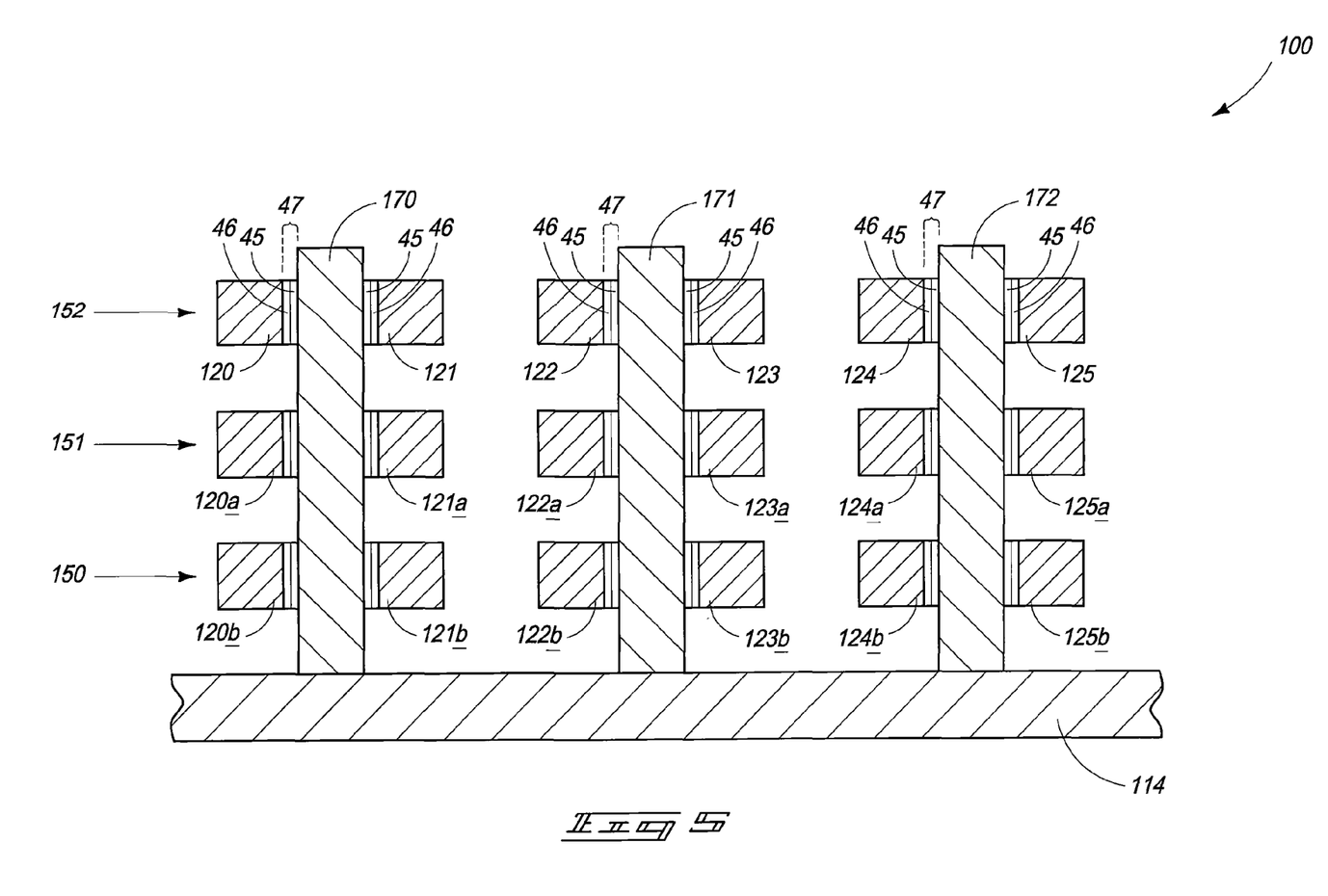
FIGS. 5 and 6 are diagrammatic cross-sectional side views along the lines 5-5 and 6-6, respectively, of FIG. 4.
Figure 6:
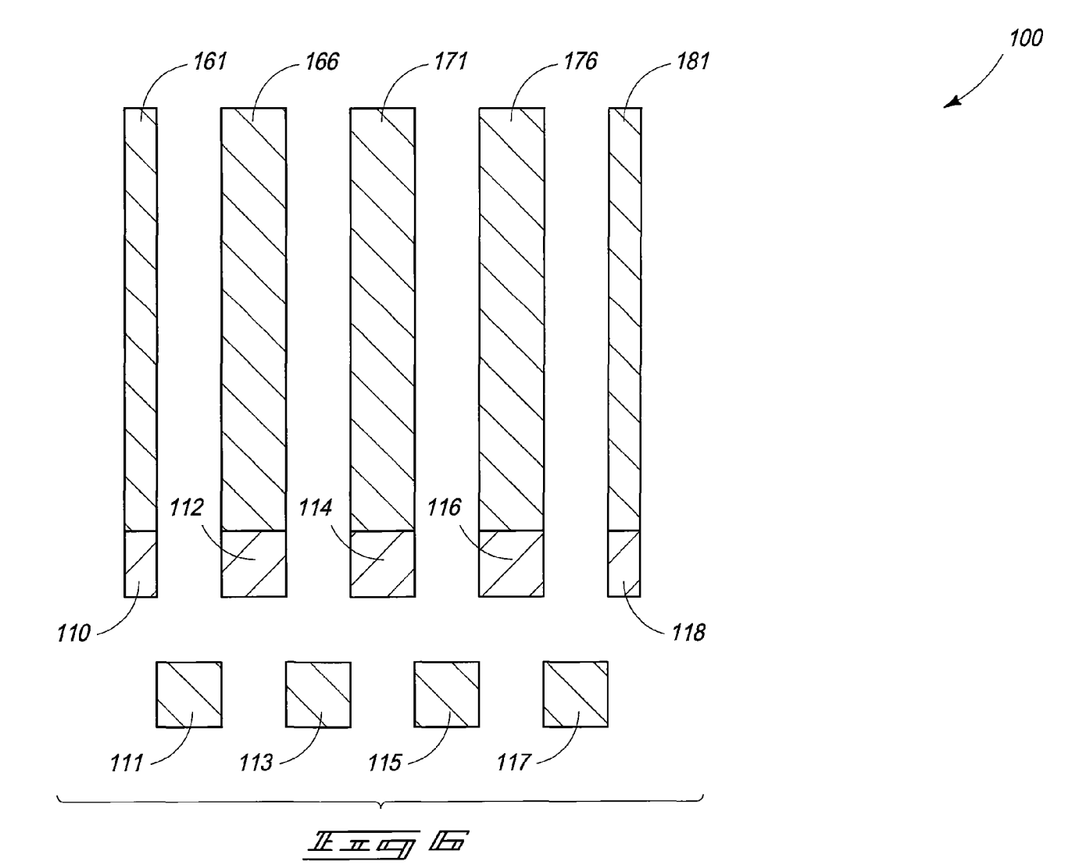

An example embodiment memory array 100 is shown in FIGS. 4-6. The top view of FIG. 4 shows that the memory array 100 comprises a plurality of global bitlines 110-118 that extend along a first horizontal direction, and comprises a plurality of wordlines 120-125 that extend orthogonally to the global bitlines. The cross-sectional side view of FIG. 5 shows that the wordlines of FIG. 4 are actually the top series of a stack of wordlines, with FIG. 5 showing two underlying series of wordlines; with the wordlines within one of the series being labeled as wordlines 120a-125a, and with the wordlines in the other series being labeled as wordlines 120b-125b. Accordingly, eighteen wordlines are shown in the cross-sectional view of FIG. 5. The eighteen wordlines form a two-dimensional wordline array having columns of three wordlines, and rows of six wordlines. The two-dimensional wordline array is one example of a diversity of different two-dimensional wordline arrays. Such wordline arrays will generally have at least two wordlines in each row of the array, and at least two wordlines in each column of the arrays.

FIGS. 4-6 show that vertical bitline pillars 160-182 extend upwardly from the global bitlines. The bitline pillars extend through the wordline array, and are between adjacent columns of such wordline array. The wordlines, bitlines and vertical bitline pillars comprise electrically conductive material, such as, for example, one or more of various metals, metal-containing compositions, and conductively-doped semiconductor materials.

Memory cell material 45 (only some of which is labeled) is provided between the wordlines and vertical bitline pillars; and access devices 46 (only some of which are labeled) are provided between the wordlines and the vertical bitline pillars. The memory cell material and access device provided between a wordline and a vertical bitline pillar together form a memory cell 47 (only some of which are labeled). The memory cell material 45 and access devices 46 of the example embodiment of FIGS. 4-6 may be the same as the memory cell material 45 and access devices 46 of the prior art described above in the "Background" section.

Although the memory cell material is shown to be a single homogeneous composition, it may comprise multiple discrete compositions in some applications. Also, although the access devices are shown to comprise single, homogeneous compositions, the access devices may comprise numerous discrete compositions; and often do comprise two or more different materials. Further, although only a single access device is shown in each memory cell, there may be multiple access devices in the individual memory cells. Also, although the memory cell material is shown adjacent the vertical bitline pillar, and the access device is shown adjacent the wordline, the relative orientations of the memory cell material and the access device may be reversed.

The cross-sectional view of FIG. 6 shows that some of the global bitlines 110-118 are formed at a different elevational level than others of the global bitlines. Specifically, the global bitlines include a first series containing bitlines 110, 112, 114, 116 and 118 that is formed at one elevational level, and a second series containing bitlines 111, 113, 115 and 117 that is formed at a different elevational level. The global bitlines of the first series alternate with those of the second series, as shown in FIG. 6.

In operation, each individual memory cell may be uniquely addressed by a combination of a global bitline and a wordline. For instance, a voltage differential between global bitline 116 and wordline 121 may be utilized to access the memory cell located at the intersection where wordline 121 crosses vertical bitline pillar 175. Such access may be utilized for writing to the memory cell by placing the memory cell in a specific data storage state, and for reading from the memory cell by ascertaining which data storage state the memory cell is in.

The wordlines within the two-dimensional wordline array of FIG. 5 may be considered to be arranged in a plurality of elevational planes 150-152, and accordingly the top view of FIG. 4 may be considered to be showing the uppermost elevational plane 152 of the wordline array. The memory array may be considered to also comprise the elevational planes 150-152, and each memory unit of the memory array may be considered to have an area along the elevational plane containing such memory unit. The area may be stated in terms of the minimum feature size, F, utilized to form the memory array. Such minimum feature size will be the widths of the bitlines, the widths of the wordlines, the widths of the vertical bitline pillars, and the widths of the spaces between the bitlines and wordlines if the memory array is fabricated to its absolute minimum dimensions.

The utilization of multiple elevational levels for the global bitlines enables the memory units of the example embodiment memory array of FIGS. 4-6 to be more tightly packed than were the memory units of the prior art memory array described in FIGS. 1-3.

The top view of FIG. 4 shows a rectangular perimeter around one of the memory units of the example embodiment memory array. Such perimeter has two sides that are of dimension 2F, and two sides that are of dimension F. Accordingly the memory unit has an area along elevational plane 152 of about $2F^2$. The area is referred to as being "about $2F^2$," rather than as being absolutely $2F^2$ because the illustrated perimeter assumes that the memory cell material 45 and access device 46 are of negligible size. Since the memory cell material 45 and access device 46 have some physical dimension, the planar area of the memory unit cell will approach $2F^2$, but will not be $2F^2$ in an absolute mathematical sense. Alternatively, the planar area of each memory cell unit may be considered to be $2F^2$ if the memory cell material and access device are ignored; or in other words may be considered to be $2F^2$ relative to the wordlines, bitlines and spaces consumed by each memory cell unit.

Figure 7:
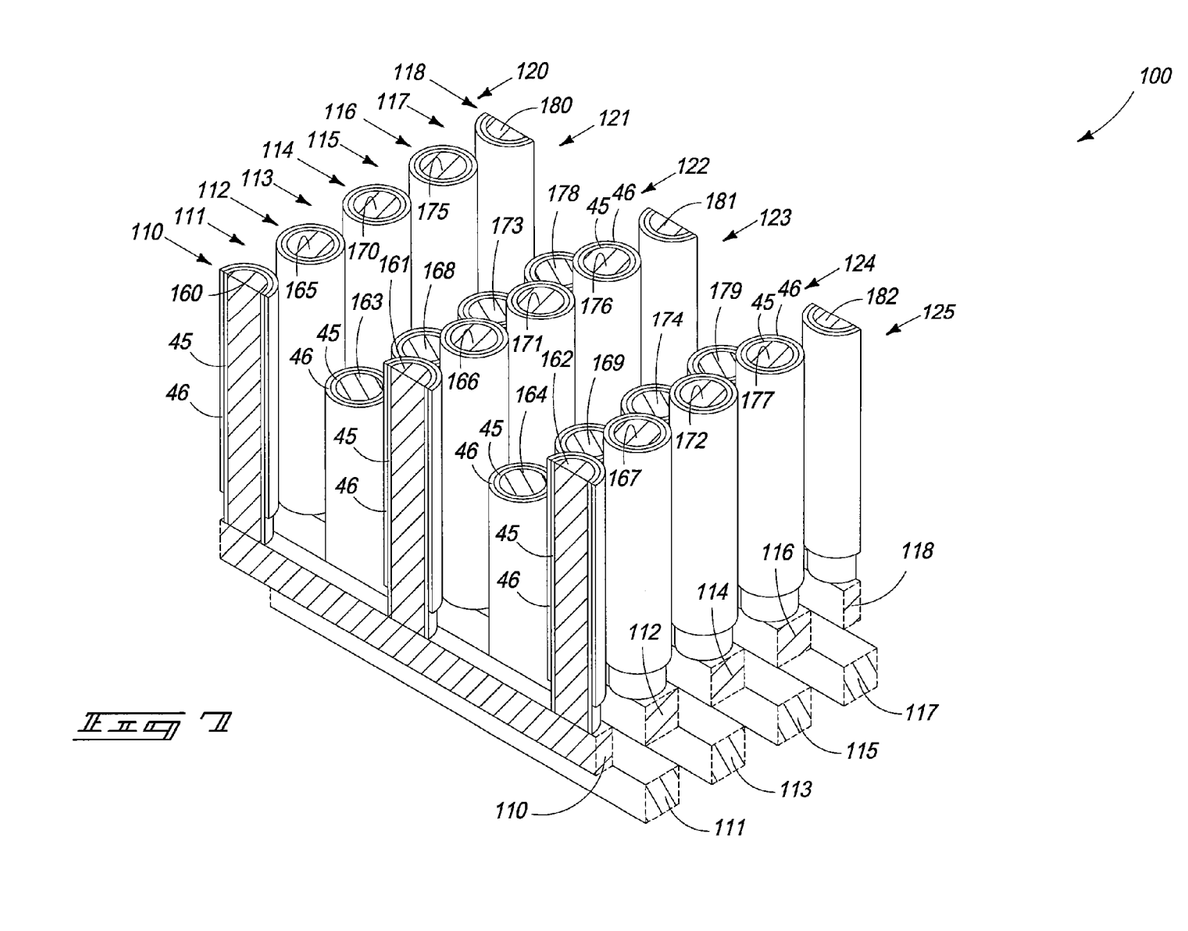
FIG. 7 is a three-dimensional view of a memory array similar to that of FIGS. 4-6.

FIG. 7 is a three-dimensional view of an example embodiment memory array analogous to that of FIGS. 4-6, which may assist the reader in visualizing such memory array. Identical number is utilized to label the components of FIG. 7 as was used to label the components of FIGS. 4-6. The locations of the wordlines 120-125 are indicated with arrows, but the wordlines are not shown in order to simplify the drawing.

The embodiment of FIG. 7 differs from that of FIGS. 4-6 in that the memory cell material 45 is contiguous around the vertical bitline pillars of FIG. 7, and is not contiguous around such vertical pillars in the embodiment of FIGS. 4-6. Accordingly, FIG. 7 shows a slightly different embodiment than FIGS. 4-6. The embodiment of FIG. 7 also shows the access devices 46 comprising material that is contiguous around the vertical bitline pillars. In yet other embodiments, the memory cell material may be contiguous around the vertical pillars, but the material of the access devices may be discontinuous around such pillars.

Figure 8:
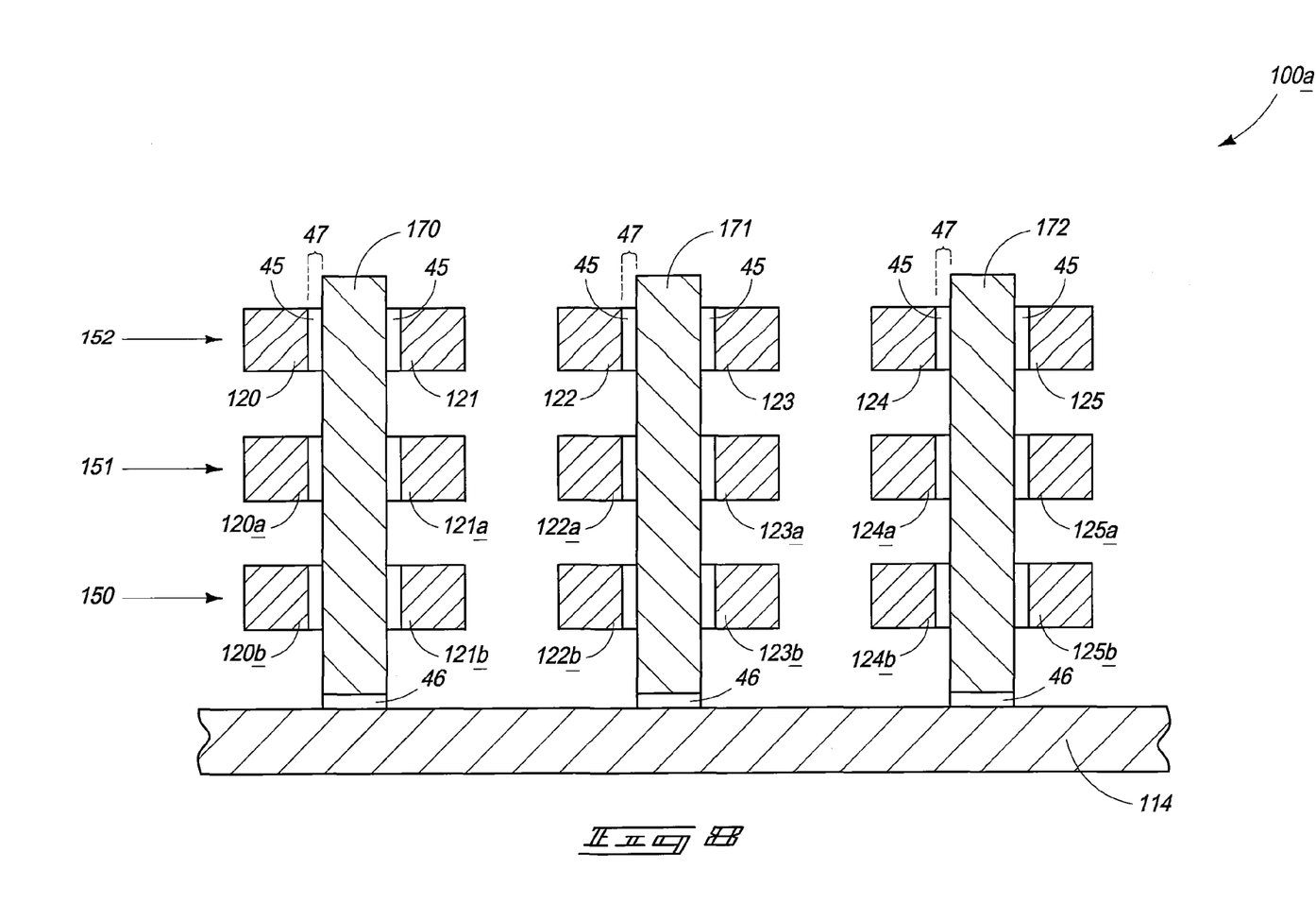
FIG. 8 is a diagrammatic cross-sectional view similar to that of FIG. 5, and shows another example embodiment memory array.

The embodiments of FIGS. 4-7 have access devices 46 adjacent memory cell material 45 in the individual memory cells 47 of the memory array. Thus, each memory cell unit comprises memory cell material and an access device. In other embodiments the access devices may be removed from the individual memory cell units to further reduce the size of the memory cell units. Specifically, the access devices may be placed in locations between the vertical pillars and the global bitlines, rather than being placed in the individual memory cell units. Accordingly, while the cross-section of FIG. 5 shows an embodiment in which the vertical bitline pillars 170-172 are ohmically connected to the global bitline 114, in other embodiments such vertical bitline pillars may be connected to the global bitline through access devices that respond non-linearly to increasing voltage (such as, for example, ovonic threshold switches). FIG. 8 shows a cross-sectional view analogous to that of FIG. 5, but shows an embodiment in which a memory array 100a has access devices 46 placed directly between the global bitline 114 and the vertical bitline pillars 170-172.

The embodiment of FIG. 8 advantageously reduces the size of the memory cells 47 by removing the access devices from such memory cells. In the embodiment of FIG. 8 the only material between the wordlines (for instance, 120-125) and the vertical bitline pillars (for instance, 170-172) is the memory cell material 45.

Figure 9:
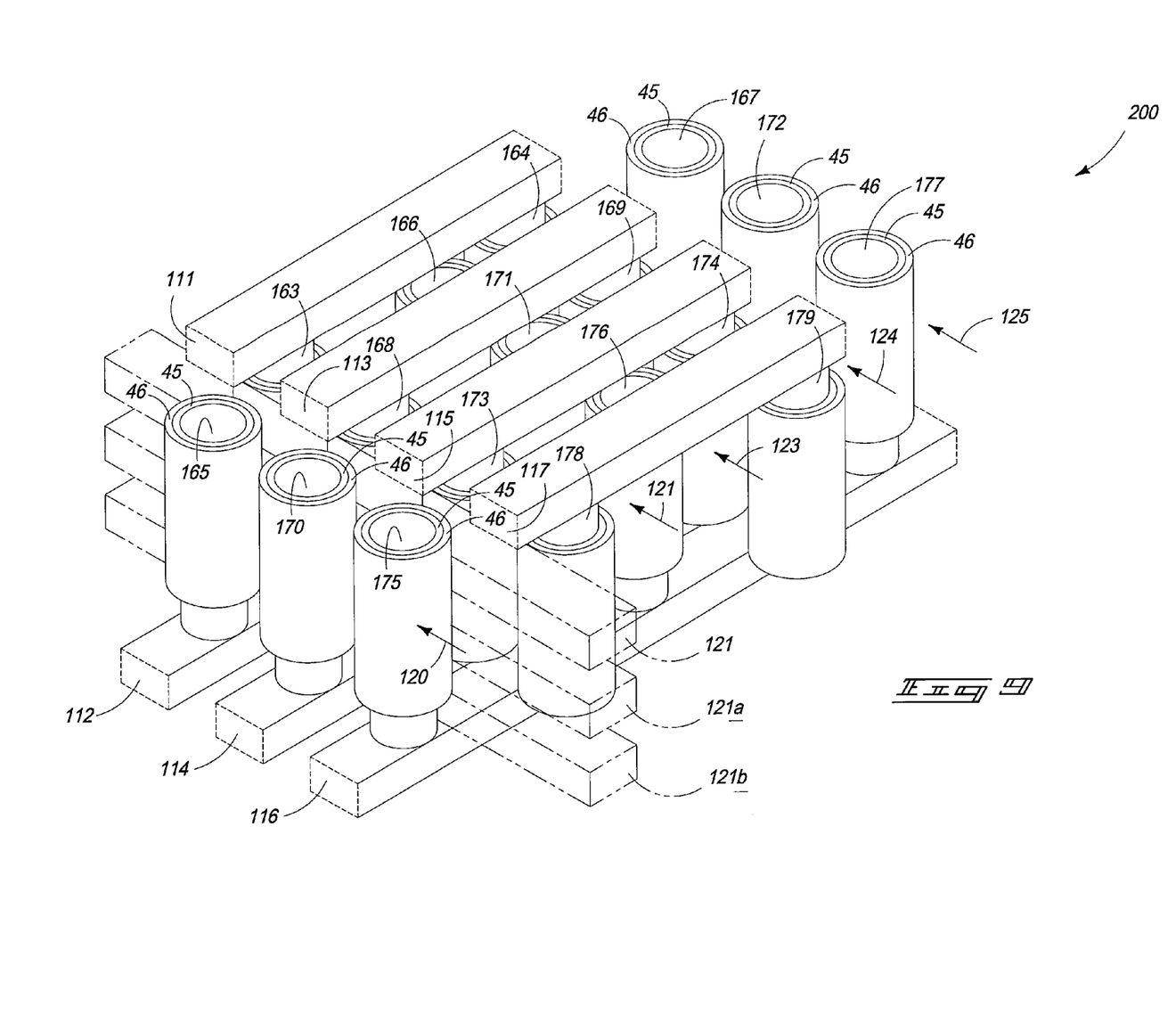
FIG. 9 is a three-dimensional view of another example embodiment memory array.

FIGS. 4-7 show embodiments in which all of the global bitlines are on the same side of the two-dimensional wordline array (specifically, the two dimensional array comprising the wordlines 120-125, 120a-125a and 120b-125b shown in FIG. 5). In other embodiments, some of the global bitlines may be on an opposite side of the wordline array relative to others of the global bitlines. FIG. 9 shows a three-dimensional view of a memory array 200 in which the some of the global bitlines are one side of a two-dimensional wordline array, and others of the global bitlines are on an opposing side of the wordline array. Identical numbering will be used to describe FIG. 9 as is utilized above for describing FIGS. 4-7. The wordlines 120-125, 120a-125a and 120b-125b are not all shown in FIG. 9 in order to simplify the drawing. Instead, only wordlines 121, 121a and 121b are shown, and the locations of wordlines 120, 122, 123, 124 and 125 are indicated with arrows.

The embodiment of FIG. 9 may be considered to have some of the global bitlines 110-118 formed at a different elevational level than others of the global bitlines. Specifically, the global bitlines include a first series containing bitlines 112, 114 and 116 that is formed at one elevational level (and specifically, below the wordlines in the shown embodiment), and a second series containing bitlines 111, 113, 115 and 117 that is formed at a different elevational level (and specifically, above the wordlines in the shown embodiment). The global bitlines of the first series alternate with those of the second series, as shown in FIG. 9.

Figure 10:
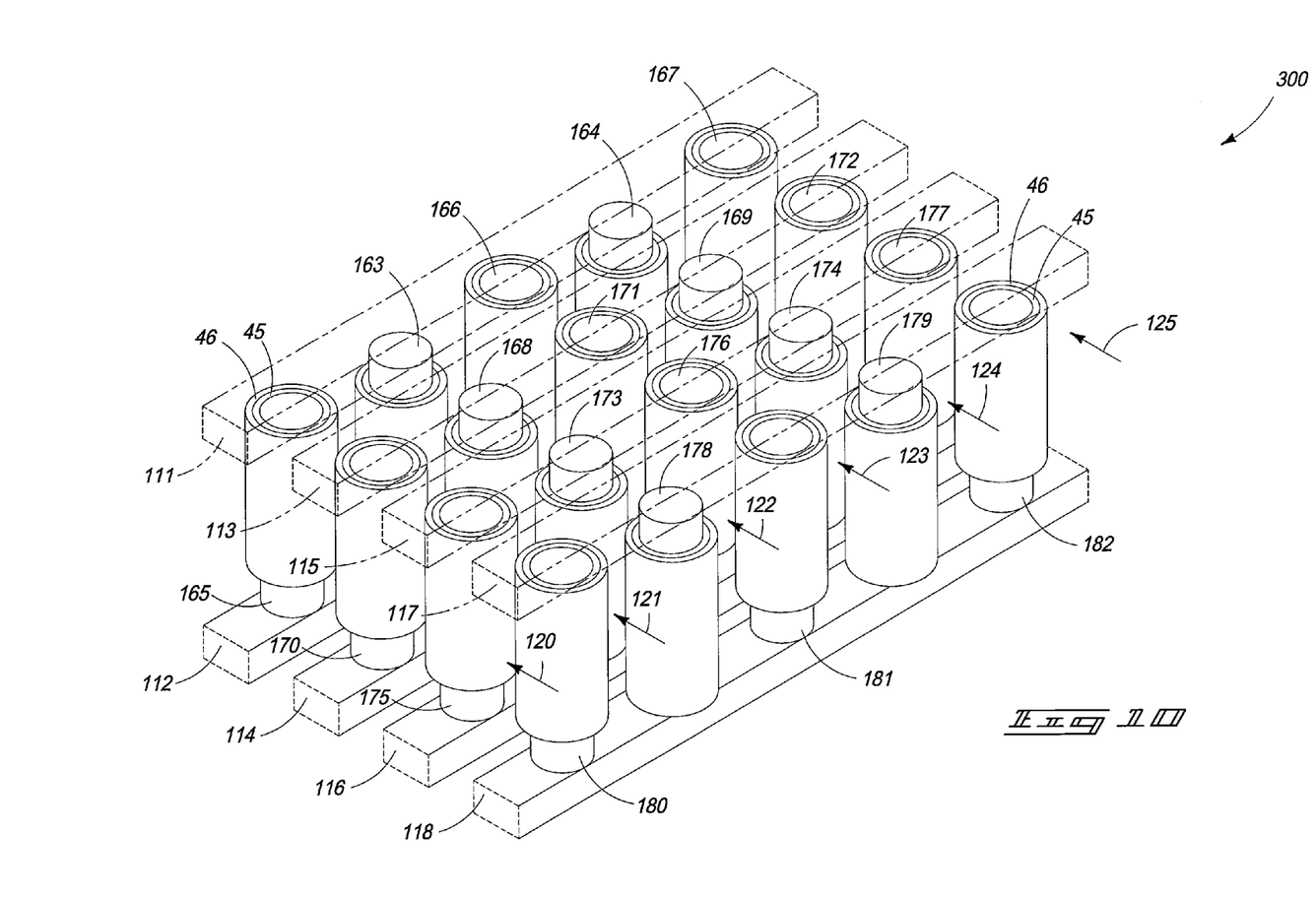
FIG. 10 is a three-dimensional view of another example embodiment memory array.

In the embodiment of FIG. 9 the global bitlines of the first series are horizontally offset from the global bitlines of the second series, so that the global bitlines of the first series are not directly over the global bitlines of the second series. In other embodiments, the global bitlines of the first series may be directly over the global bitlines of the second series, as shown in FIG. 10 with reference to a memory array 300. The wordlines are not shown in FIG. 10 in order to simplify the drawing. However, locations of wordlines 120-125 are indicated with arrows.

The embodiments of FIGS. 9 and 10 may, like the embodiment of FIGS. 4-6, form an array in which the planar area of individual memory cell units is $2F^2$ relative to the wordlines, bitlines and spaces consumed by the individual memory cell units.

The access devices may be in the memory cells of the embodiments of FIGS. 9 and 10 as shown, or may be between the vertical bitline pillars and the global bitlines in other embodiments analogous to the embodiment of FIG. 8.

The combination of a global bitline and the vertical pillars attached thereto may be considered to form a structure analogous to a comb. In the embodiment of FIGS. 4-7, such combs may be considered to be within two series that are elevationally offset relative to one another; with one series comprising global bitlines 110, 112, 114, 116 and 118, and the other series comprising global bitlines 111, 113, 115 and 117. The combs of both series are parallel to one another and all have the vertical pillars extending in the same direction. In contrast, in the embodiments of FIGS. 9 and 10, one series of combs has the vertical pillars extending upwardly, while the other series of combs has the vertical pillars extending downwardly. For instance, the embodiment of FIG. 10 has global bitlines 111, 113, 115, and 117 within a first series of combs; and has global bitlines 112, 114, 116 and 118 within a second series of combs. The first series is exemplified by global bitline 118 and the vertical pillars 180, 181 and 182 attached thereto; while the second series is exemplified by the combination of global bitline 117 and the vertical pillars 178 and 179 attached thereto. The first series of combs has vertical pillars extending upwardly, and the second series has vertical pillars extending downwardly.

The memory arrays described herein may be incorporated into integrated circuitry, and thus may be supported by a semiconductor substrate in some applications. The memory arrays may be formed by any suitable processing.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

When an element as a layer, region or substrate is referred to as being "against" another element, it can be directly against the other element or intervening elements may also be present. In contrast, when an element is referred to as being "directly against" another element, there are no intervening elements present. When an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

The term "directly over" is used to indicate vertical alignment of structures, and is distinguished from the term "over" which merely indicates that one structure is above another. Accordingly, a first structure is over a second structure if the first structure is above the second structure regardless of any lateral displacement that may exist between the first and second structures; and a first structure is "directly over" a second structure if the first structure is vertically aligned with the second structure.

If one or more substances are referred to as being "directly between" a pair of structures, the term "directly between" is used to indicate that the one or more substances are sandwiched within a gap between the two structures.

The embodiments discussed above may be utilized in electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory array, comprising:
    global bitlines extending along a first horizontal direction; the global bitlines comprising a first series at a first elevational level, and a second series at a second elevational level which is different from the first elevational level; the global bitlines of the first series alternating with the global bitlines of the second series;
    vertical local bitlines extending perpendicularly to the global bitlines;
    wordlines extending along a second horizontal direction which is perpendicular to the first horizontal direction; the wordlines being stacked in a two-dimensional array comprising vertical columns and horizontal rows; the vertical columns of the wordline array comprising two or more wordlines; the vertical local bitlines extending through the wordline array so that vertical local bitlines are between adjacent vertical columns of the wordline array; and
    memory cell material directly between the wordlines and the vertical local bitlines; the memory cell material forming a plurality of memory cells uniquely addressed by wordline/global bitline combinations.

2. The memory array of claim 1 wherein the global bitlines of the first series are on an opposite side of the wordlines as the global bitlines of the second series.

3. The memory array of claim 2 wherein the global bitlines of the first series are directly over the global bitlines of the second series.

4. The memory array of claim 2 wherein the global bitlines of the first series are not directly over the global bitlines of the second series.

5. The memory array of claim 1 wherein the global bitlines of the first series are on a common side of the wordlines as the global bitlines of the second series.

6. The memory array of claim 1 wherein the memory cell material is the only material directly between the wordlines and the vertical local bitlines.

7. The memory array of claim 6 wherein the memory cell material is a phase change material.

8. The memory array of claim 1 wherein non-linear access devices are directly between the wordlines and the bitlines together with the memory cell material.

9. The memory array of claim 1 wherein ovonic threshold switches are directly between the wordlines and the bitlines together with the memory cell material.

10. The memory array of claim 1 wherein non-linear access devices are directly between the global bitlines and the vertical local bitlines.

11. The memory array of claim 1 wherein ovonic threshold switches are directly between the global bitlines and the vertical local bitlines.

12. The memory array of claim 1 wherein the global bitlines of the first series are on an opposite side of the wordlines as the global bitlines of the second series; wherein the memory cell material is the only material directly between the wordlines and the vertical local bitlines; and wherein the memory cell material is phase change material.

* * * * *